United States Patent [19]
Slesinger

[11] Patent Number: 6,016,949
[45] Date of Patent: Jan. 25, 2000

[54] INTEGRATED PLACEMENT AND SOLDERING PICKUP HEAD AND METHOD OF USING

[75] Inventor: Kris Allan Slesinger, Charlotte, N.C.

[73] Assignee: International Business Machines Corporation, Armonk, N.Y.

[21] Appl. No.: 08/886,242

[22] Filed: Jul. 1, 1997

[51] Int. Cl.[7] .................................................. B23K 35/00
[52] U.S. Cl. ............................. 228/180.22; 228/180.21; 228/212; 228/232
[58] Field of Search ...................... 228/180.21, 180.22, 228/6.2, 232, 212

[56] References Cited

U.S. PATENT DOCUMENTS

| | | | |
|---|---|---|---|
| 3,453,714 | 7/1969 | Clark et al. ............................... | 29/203 |
| 3,499,203 | 3/1970 | Clark et al. ............................... | 29/203 |
| 3,791,018 | 2/1974 | Johnston et al. ........................ | 29/471.1 |
| 4,160,893 | 7/1979 | Meyen et al. ........................ | 219/85 BA |
| 4,501,064 | 2/1985 | DiNozzi et al. ........................... | 29/832 |
| 4,610,388 | 9/1986 | Koltuniak et al. ........................ | 228/6.2 |
| 4,696,101 | 9/1987 | Vanzetti et al. ........................... | 29/740 |
| 4,756,077 | 7/1988 | Bianchi ..................................... | 29/740 |
| 4,788,403 | 11/1988 | Hayakawa et al. ................. | 219/85 BA |
| 4,828,162 | 5/1989 | Donner et al. ............................ | 228/6.2 |
| 4,967,950 | 11/1990 | Legg et al. ............................. | 228/180.2 |
| 4,979,664 | 12/1990 | Lyons et al. .......................... | 228/180.2 |
| 4,984,731 | 1/1991 | Imamura ................................ | 228/102 |
| 5,010,227 | 4/1991 | Todd ..................................... | 219/85.16 |
| 5,023,426 | 6/1991 | Prokosch et al. .................... | 219/121.63 |
| 5,029,383 | 7/1991 | Snyder et al. ............................ | 29/740 |
| 5,033,665 | 7/1991 | Todd ..................................... | 228/103 |
| 5,060,288 | 10/1991 | Spigarelli et al. ..................... | 392/412 |
| 5,084,962 | 2/1992 | Takahashi et al. ....................... | 29/833 |
| 5,150,827 | 9/1992 | Fries ..................................... | 228/44.7 |
| 5,211,325 | 5/1993 | Schweizer et al. ..................... | 228/105 |
| 5,262,355 | 11/1993 | Nishiguchi et al. .................... | 437/209 |
| 5,349,500 | 9/1994 | Casson et al. ......................... | 361/749 |
| 5,377,405 | 1/1995 | Sakurai et al. ............................ | 29/833 |
| 5,379,514 | 1/1995 | Okuda et al. ............................ | 29/833 |
| 5,482,198 | 1/1996 | Kohn ....................................... | 228/6.2 |
| 5,483,421 | 1/1996 | Gedney et al. ........................ | 361/771 |
| 5,526,974 | 6/1996 | Gordon et al. ......................... | 228/103 |
| 5,613,632 | 3/1997 | Kohn ..................................... | 228/246 |
| 5,639,011 | 6/1997 | Jacks et al. ........................ | 228/180.21 |
| 5,735,450 | 4/1998 | Heim et al. ............................ | 228/191 |
| 5,785,237 | 7/1998 | Lasto et al. ........................ | 228/180.22 |

FOREIGN PATENT DOCUMENTS

| | | |
|---|---|---|
| 61-167802 | 7/1986 | Japan . |
| 62-067894 | 3/1987 | Japan . |
| 62-276840 | 12/1987 | Japan . |
| 63-157431 | 6/1988 | Japan . |

*Primary Examiner*—Patrick Ryan
*Assistant Examiner*—Kiley Stoner
*Attorney, Agent, or Firm*—Schmeiser, Olsen & Watts; Lawrence R. Fraley

[57] ABSTRACT

A pickup head adapted to pick up an electronic component from a supply source, support the component during transport from the supply source to a substrate, and position the electronic component at a site on the substrate has a means for heating the electronic component during pickup, transport and positioning the chip, to a temperature sufficient to effect solder reflow when the electronic component is placed on the substrate. The pickup head, and method of using the head, effectively reduce the problems associated heretofore with solder reflow attachment of individual components by reducing the number of process steps, faster attachment cycle times, and reduced manufacturing costs.

3 Claims, 5 Drawing Sheets

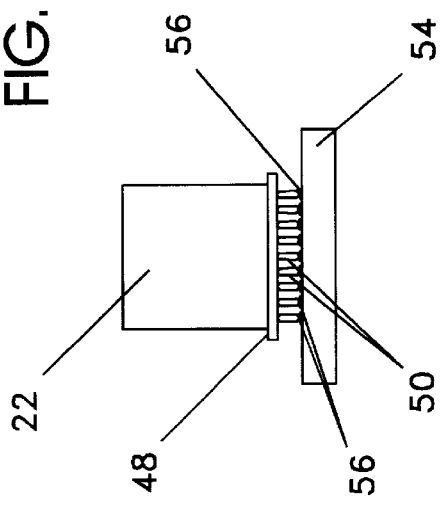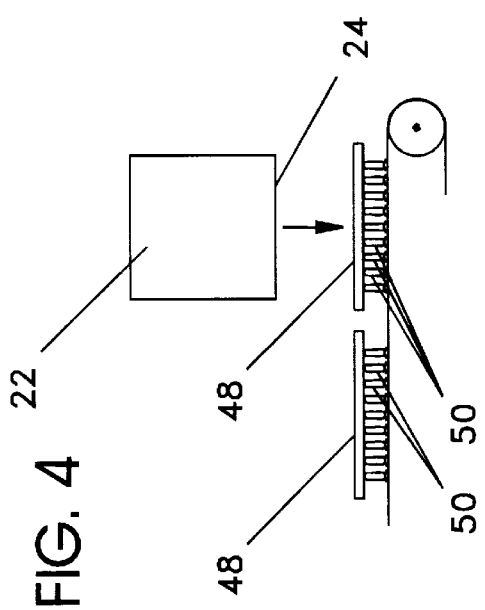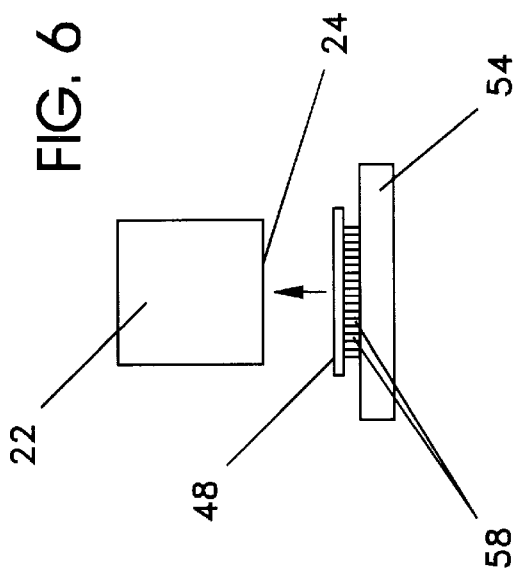

INTEGRATED PLACEMENT AND SOLDERING PICKUP HEAD AND METHOD OF USING

BACKGROUND OF THE INVENTION

1. Technical Field

This invention relates generally to a pickup head adapted for use as a robot arm end effector, and more particularly to such a pickup head having a heated vacuum tip, and a method of using such a pickup head.

2. Background Art

The attachment of small electronic components, such as C4 (Controlled Collapse Chip Connection) devices, other flip chips and similar devices, to printed circuit boards (PCBs) or other substrate members currently requires several distinct assembly steps. First, soldering flux is applied to the electrical contacts of the chip and/or the substrate member. Next, the chip is acquired from a feed station and placed onto the substrate with high-accuracy positioning equipment. The adhesive properties of the flux hold the chip in place until it can be permanently soldered in place. Soldering is the final step of the attachment process. Depending on the production volumes and/or the capital investment, soldering is performed either via mass reflow or local reflow equipment.

A The term mass reflow means that all of the electronic components on a given printed circuit board are soldered simultaneously. Typically, solder required to make the permanent physical and electrical connection reaches reflow (melting) temperature via a conveyorized heating method. The primary advantage of this method is throughput, since a reflow oven doesn't care how many solder joints are soldered at one time. However, mass reflow processes require considerable capital investment in an oven and conveyorized handling equipment suitable for transporting components through the oven, and floor space. The flux used for flip chip attachment typically has very weak adhesive strength. Therefore, extreme care is required during transfer of chips between placement and reflow stations.

Local reflow methods have heretofore been slow, and as a result, costly. Convection heating, e.g. via hot gas flow and/or infrared elements, are used to bring the chip and the surrounding substrate area to solder reflow temperatures. Typically, this requires on the order of one to three minutes per chip. Depending on the chip size, the board location, and the proximity of the chip to other components, each chip is likely to require a unique heating profile, i.e., controlled heating element parameters such as gas flow rate, gas temperature, dwell time, and other process variables. Typically, the development of specific heating profiles requires many iterations before the process equipment is tuned to obtain the desired results, during the course of which many costly test samples are destroyed before the parameters are optimized.

The present invention is directed to overcoming the problems set forth above. It is desirable to have a means, including both and an apparatus and a method of using the apparatus whereby small electrical components can be attached to a substrate without subjecting previously attached components to a another heat cycle. It is also desirable to have an apparatus that can attach individual chips to a substrate without sacrificing the advantageous cycle time provided by mass reflow equipment. Furthermore, it is desirable to have a device that can pick up an electronic component from a supply source, transport the component to a work station at which a substrate is disposed, position the component with respect to a specific predetermined site on the substrate, and place the component on the predetermined site. Advantageously, during pickup, transport, positioning and placing, the component is simultaneously heated so that when the component is placed on the substrate, solder previously coated onto contacts on the component is heated to its reflow temperature. Alternatively, the component contacts are heated to a temperature sufficient reflow solder deposited on the substrate contacts. Thus, the total cycle time for placing an electronic component on a substrate is measured in terms of a few seconds rather than the previously required minutes.

SUMMARY OF THE INVENTION

In accordance with one aspect of the present invention, a pickup head for retrieving and transporting an electronic component having at least one contact member adapted for solder connection to a substrate, and positioning the electronic component on the substrate, comprises a robot interface plate disposed at a first end of the pickup head and a vacuum tip disposed at a second end of the pickup head. The vacuum tip has an electronic component contact surface and a vacuum inlet port disposed on the component contact surface that is in fluid communication with a vacuum source. The pickup head further includes an electrical heating element disposed within the vacuum tip whereby heat is controllably transferred to the electronic component contact surface.

Other features of the pickup head embodying the present invention include at least one discharge port disposed adjacent the vacuum tip that is arranged to provide a flow of protective shielding gas around the electronic component when the component is in contact with the electronic component contact surface of the vacuum tip. Additional features include the robot interface plate having a plurality of spring-biased electrical contacts, a vacuum discharge port, and a protective shielding gas supply port, all of which are disposed on the robot interface plate. The spring-biased electrical contacts are in electrical communication with the electrical heating element disposed within the vacuum tip, the vacuum discharge port is in fluid communication with the vacuum inlet port disposed on the component contact surface of the vacuum tip, and the protective shielding gas supply port is in fluid communication with at least one discharge port disposed adjacent the vacuum tip. Other features include the vacuum tip having a thermocouple, internally disposed within the tip, which is in electrical communication with a thermocouple output signal connector disposed on the robot interface plate of the pickup head.

In another aspect of the present invention, a vacuum tip for a pickup head has an electronic component contact surface, a vacuum port disposed on said component contact surface in fluid communication with a vacuum source, and an electrical heating element disposed within the vacuum tip whereby heat is controllably transferred to the electronic component contact surface.

In yet another aspect of the present invention, a pickup head is adapted to pick up an electronic component from a supply source, support the electronic component during transport from the supply source to a substrate, position the electronic component at a predetermined site on the substrate during attachment of the component to the substrate, and hold the electronic component at the predetermined site on the substrate. The pickup head further has a means for heating the electronic component, during pickup, transport and positioning, to a temperature sufficient to effect solder reflow when the electronic component is held at the predetermined site of the substrate.

In accordance with yet another aspect of the present invention, a method for attaching an electronic component to a substrate on which at least one of the electronic components and the substrate has solder predisposed on at least one contact member thereof, includes picking the electronic component from a supply source, simultaneously transporting the electronic component from the supply source while heating the component, and positioning the electronic component over a preselected site defined on the substrate while simultaneously heating the electronic component to a temperature sufficient to effect solder reflow of the solder predisposed on at least one contact member of either the electronic component or the substrate. The method further includes placing the electronic component on the preselected site defined on the substrate and simultaneously holding the electronic component on the preselected site defined on the substrate and interrupting the heating of the electronic component, whereby the temperature of the electronic component drops to a temperature below the temperature sufficient to effect solder reflow, and the solder becomes solidified.

Other features of the method for attaching an electronic component to a substrate, embodying the present invention, include flowing a stream of a shielding gas over the electronic component during transporting, positioning and placing the electronic component.

BRIEF DESCRIPTION OF THE SEVERAL VIEWS OF THE DRAWING

A more complete understanding of the structure and operation of the present invention may be had by reference to the following detailed description when taken in conjunction with the accompanying drawings, wherein:

FIG. 4 is a schematic diagram of the initial step of a process using the pickup head embodying the present invention, in which the pickup head is used to pick up an electronic component from a supply source;

FIG. 5 is a schematic view of a subsequent step in the process using the pickup head embodying the present invention, in which the component is placed on a substrate;

FIG. 6 is a schematic illustration of the final step in the process using the pickup head embodying the present invention, in which the pickup head is lifted from the electronic component.

DETAILED DESCRIPTION OF PRESENTLY PREFERRED EXEMPLARY EMBODIMENTS

Figure 1:
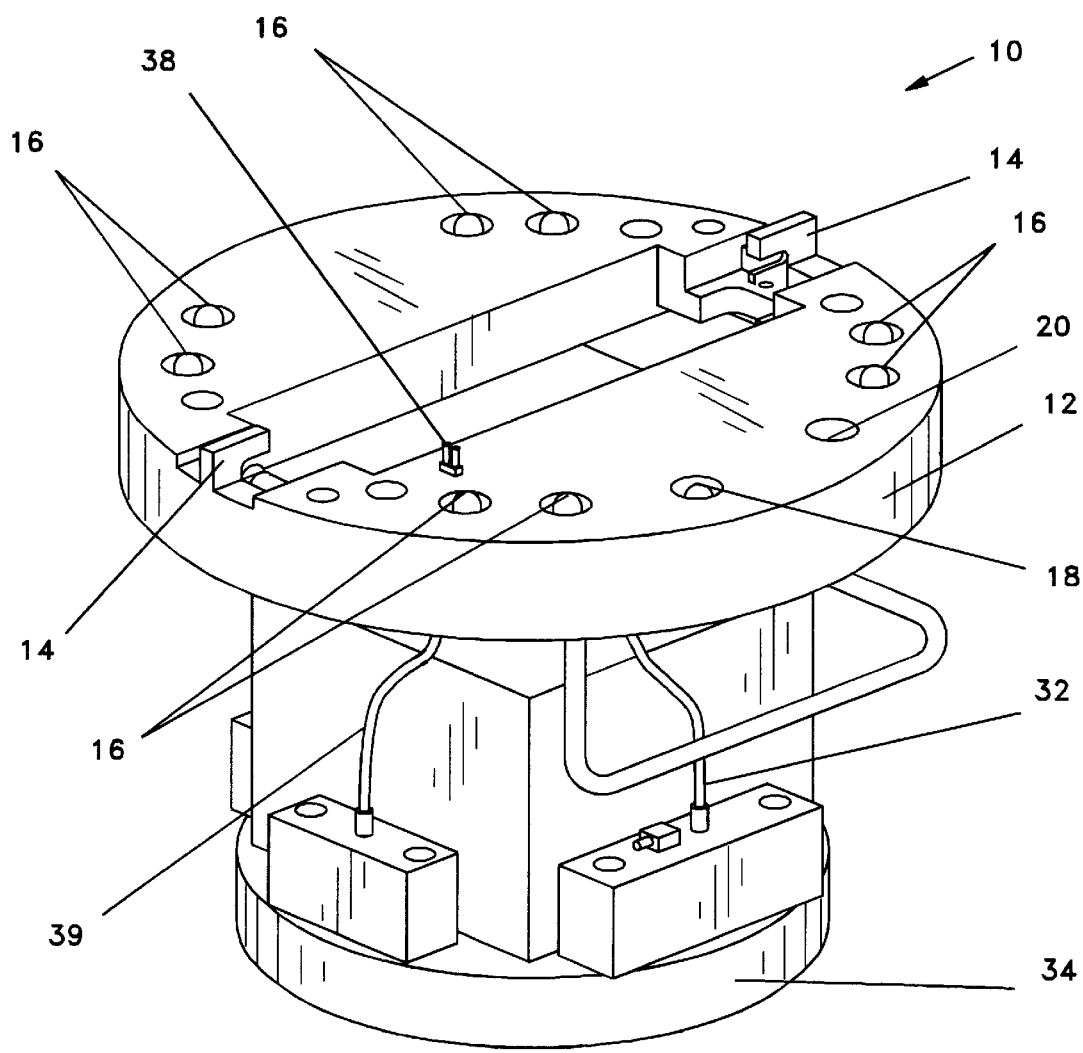
FIG. 1 is a three-dimensional view of the pickup head embodying the present invention.
Figure 2:
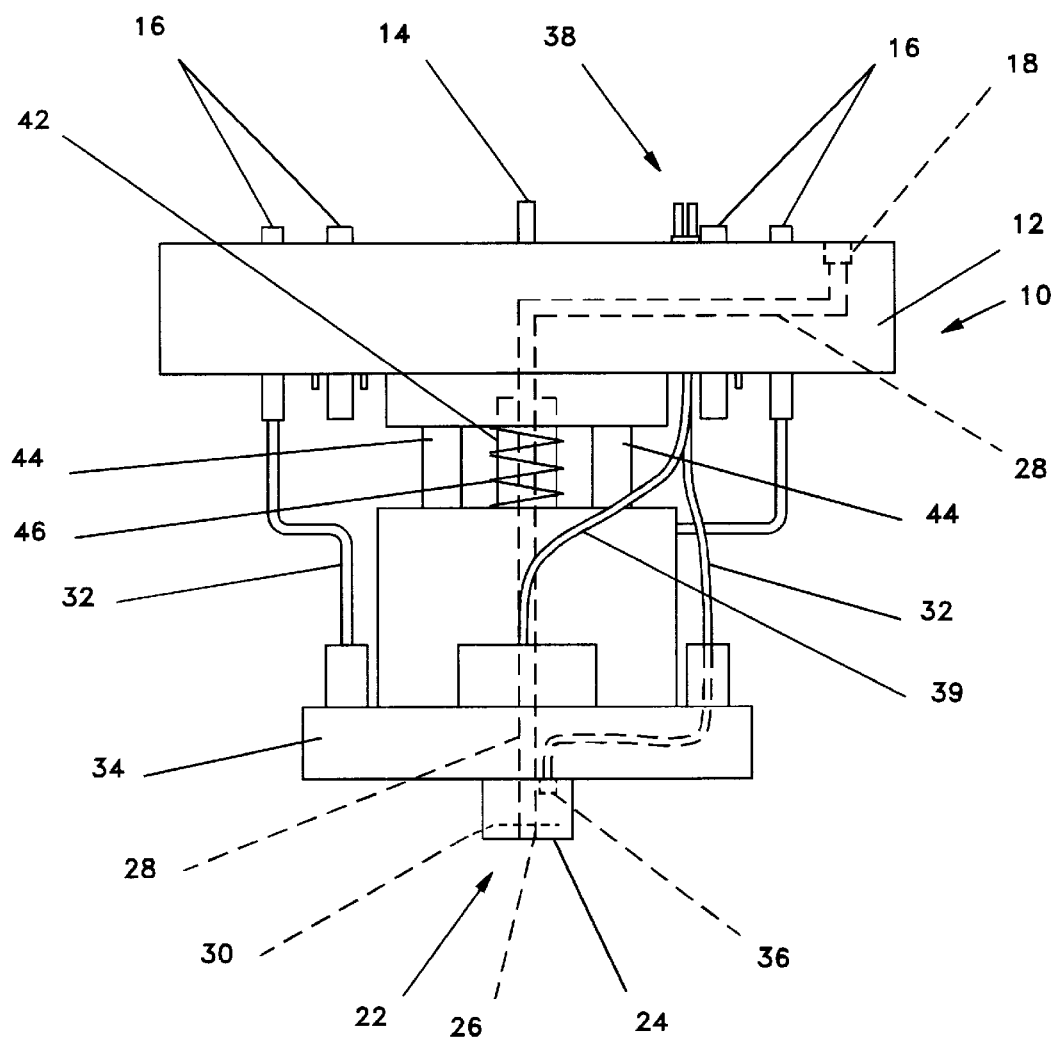
FIG. 2 is a plan view of the pickup head embodying the present invention.
Figure 3:
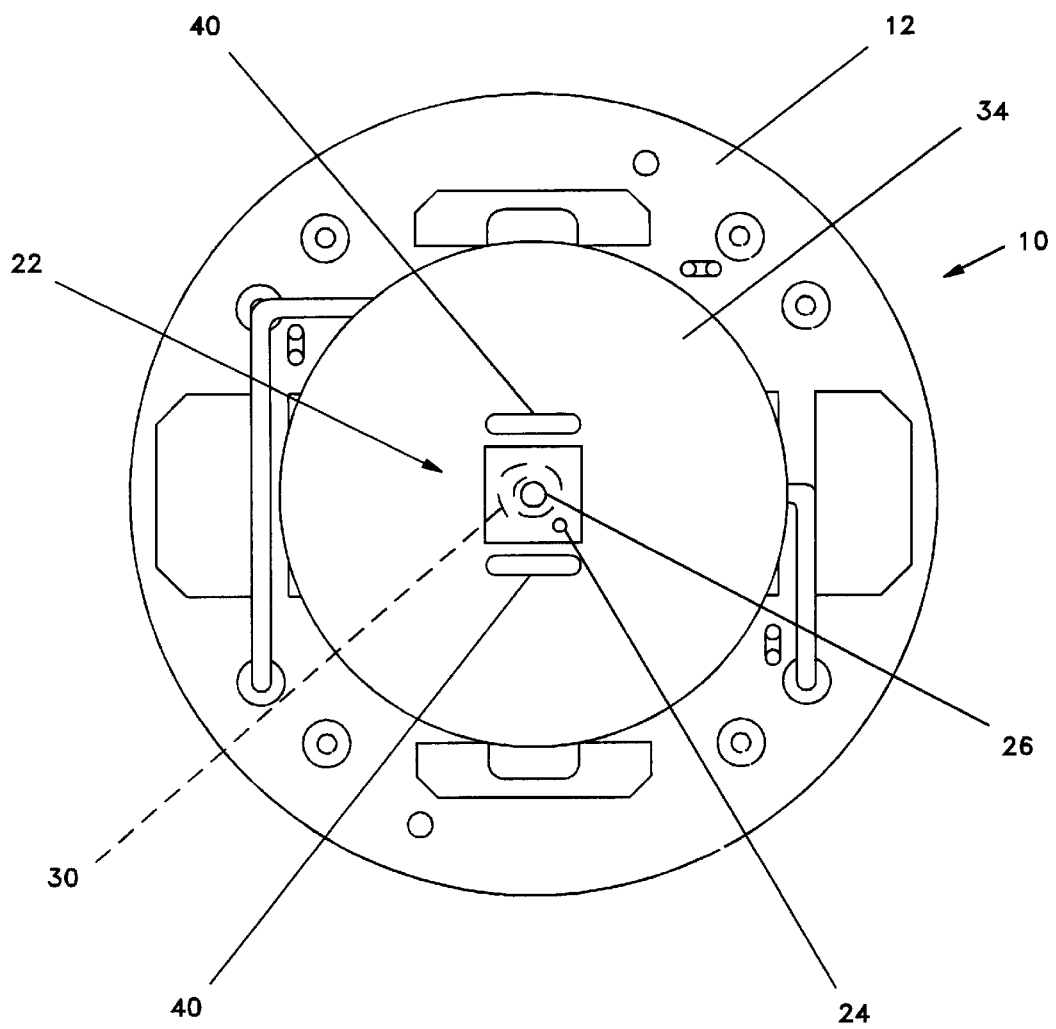
FIG. 3 is a bottom view of the pickup head embodying the present invention.

The above-mentioned problems associated with the attachment of chips and other electronic components to substrate members such as printed circuit boards, are minimized by the present invention as a result of integrating the soldering function with the chip placement operation. In the preferred embodiment of the present invention, a pickup head 10, adapted for retrieving, transporting, positioning and placing a prefabricated electronic component on a substrate, in which either the electronic component or the substrate has a thin layer of solder predisposed on a respective contact, is shown in FIGS. 1–3. The pickup head 10 has a robot interface plate 12 that is attachable to a robot arm, not shown, so that the pickup head 10 forms the end effector of the robot arm. Attachment of the pickup head 10 is provided by a pair of hooks 14 extending outwardly from the upper surface of the robot interface plate 12, which are adapted to engage mating receivers provided on the end of the robot arm.

The robot interface plate 12 also has a plurality of spring-biased electrical contacts 16 that are arranged to mate with electrical contacts provided on the end of the robot arm and which are in electrical communication with a controller, not shown, to controllably vary the electrical current provided to the spring biased electrical contacts 16. The robot interface plate 12 further has a vacuum discharge port 18 that is in fluid communication with a source of vacuum, such as the upstream side of a blower or, vacuum pump, and a protective shielding gas supply port 20 that is in fluid communication with a source of a protective shielding gas, such as nitrogen.

The pickup head 10 also includes a vacuum tip 22 disposed at a second end of the pickup head 10. The vacuum tip 22 is preferably formed of a high temperature ceramic material such as beryllium oxide and has an electronic component contact surface 24 disposed on the lower external surface of the vacuum tip 22. A vacuum inlet port 26 is disposed in the vacuum tip 22, and provides fluid communication via an internal passageway 28 extending between the electrical component contact surface 24 and the vacuum discharge port 18 disposed in the robot interface plate 12.

Importantly, a heating element 30 is internally disposed within the vacuum tip 22. In the preferred embodiment, as represented by dashed lines in FIGS. 2 and 3, the heating element 30 comprises a resistance element, e.g. tungsten wire, arranged in a serpentine pattern around the vacuum inlet port 26. The heating element 30 is electrically connected to respective ones of the spring-biased electrical contacts by wires 32 extending from the vacuum tip 22, through a vacuum tip support member 34, to the robot interface plate 12. Also, a thermocouple 36 is internally disposed within the vacuum tip 22 to sense the temperature of the vacuum tip 22. A voltage differential signal, representative of the sensed temperature, is delivered to a thermocouple connector 38 disposed on the robot interface plate 12. The output signal from the thermocouple 36 is thus delivered through the connector 38 to a conventional programmable temperature controller, which as mentioned above, regulates the flow of electrical current to the resisting heating element 30 disposed within the vacuum tip 22. Alternatively, instead of a separate programmable temperature controller, the flow of current to the resistance heating element 30 may be computer controlled, for example, by the same computer that controls the movement and operation of the robot on which the pickup head 10 is mounted.

In the preferred embodiment of the present invention, the pickup head 10 further includes at least one, and preferably two or more, protective shielding gas supply ports 40 that are disposed of in a lower surface of the vacuum tip support member 34 at a position adjacent to the vacuum tip 22. The protective shielding gas supply ports 40 are arranged to provide a flow of protective shielding gas, e.g., a relatively inert gas such as nitrogen, around an electronic component when the electronic component is in contact with the electronic component contact surface 24 of the vacuum tip 22.

The shielding gas discharge port is in fluid communication, via internal passageways arranged substantially parallel to the internally disposed vacuum passageways 28 and, therefore, not directly viewably in the drawings. Both the internal vacuum passageway 28 and the internal shielding gas supply passageway extend vertically upwardly through the vacuum tip support member 34 through a cylinder 42. The cylinder 42 extends into the robot interface plate 12 and is sealed by O-rings, not shown, disposed between the outer diameter of the cylinder 42 and the robot interface plate 12, and is thus vertically movable with respect to the robot interface plate 12. The passageways disposed within the cylinder 42 respectively communicate with the vacuum discharge port 18 or the shielding gas supply port 20 via horizontal passageways within the robot interface plate 12.

The vacuum tip support member 34, and accordingly the vacuum tip 22 mounted on the support member 34, are vertically moveably mounted on a pair of laterally spaced guide rods 44. A spring 46 is mounted around the sealed cylinder 42 and provides a controlled bias force between the robot interface plate 12 and the vacuum tip support member 34 so that when the pickup head 10 is moved into contact with a mounting surface for a chip, the vacuum tip 22 is capable of lightly biased vertical displacement with respect to the robot interface plate 12.

Thus, it can be seen that the pickup head 10 embodying the present invention has a vacuum tip 22 constructed to pick up and hold an electrical component as a result of suction provided at the vacuum inlet port 26, and heating the electronic component while being held by tip 22 via the internally positoned heating element 30. A method for attaching electronic components to a substrate is graphically illustrated in FIGS. 4–6, and a in process flow diagram comprising FIG. 7. The following description of the method will be presented with reference to all four figures. In an initial step of the method for attaching electronic components 48, such as C4 chips having a eutectic tin-lead solder predisposed on electrical contacts 50 provided on a lower surface of the chip 48, the vacuum tip 22 of the head 10 is brought into contact with an upper relatively smooth surface of the chip 48, as illustrated in FIG. 4, and picked up, as indicated at block 60 in FIG. 7, from a source of chips, such as a conveyorized feeder 52. Vacuum flow is maintained during subsequent handling of the chip 48 so that the chip 48 is retained in a respective fixed position with respect to the vacuum tip 22. After pickup, the chip 48 is simultaneously transported from the supply source 52 to a work station having a preformed substrate member 54, e.g., a printed circuit board, disposed at a designated position at the work station, while heating the chip 48 during transportation, as represented at block 62 in FIG. 7.

Either the contacts on the chip 48, or alternatively, the preformed contact areas 56 on the chip 48 are precoated with a thin layer of solder. In the illustrative preferred embodiment of the present invention, the solder coating on the respective contact is a eutectic tin-lead solder having a reflow or melting temperature of about 183° C.

As soon as the chip 48 is transported to the substrate 54, the chip 48 is positioned, for example by the use of visual imaging equipment, at a respective designated site on the substrate in alignment with the contact areas 56, while maintaining heating of the chip 48 during positioning, as indicated at block 64. Because of the low mass and thermal conductivity of typical C4 chips, and the rapid ramp rate of thin wire resistance heaters, the contacts 50 of the chips are able to reach reflow temperature within about three to five seconds after pickup from the supply source 52. This amount of time is normally required to perform the transportation and machine vision imaging steps necessary to achieve accurate placement of the chip 48 on the substrate 54. Hence, solder attachment of the chip 48 to the substrate 54 can be accomplished with insignificant impact on overall cycle time.

Figure 7:
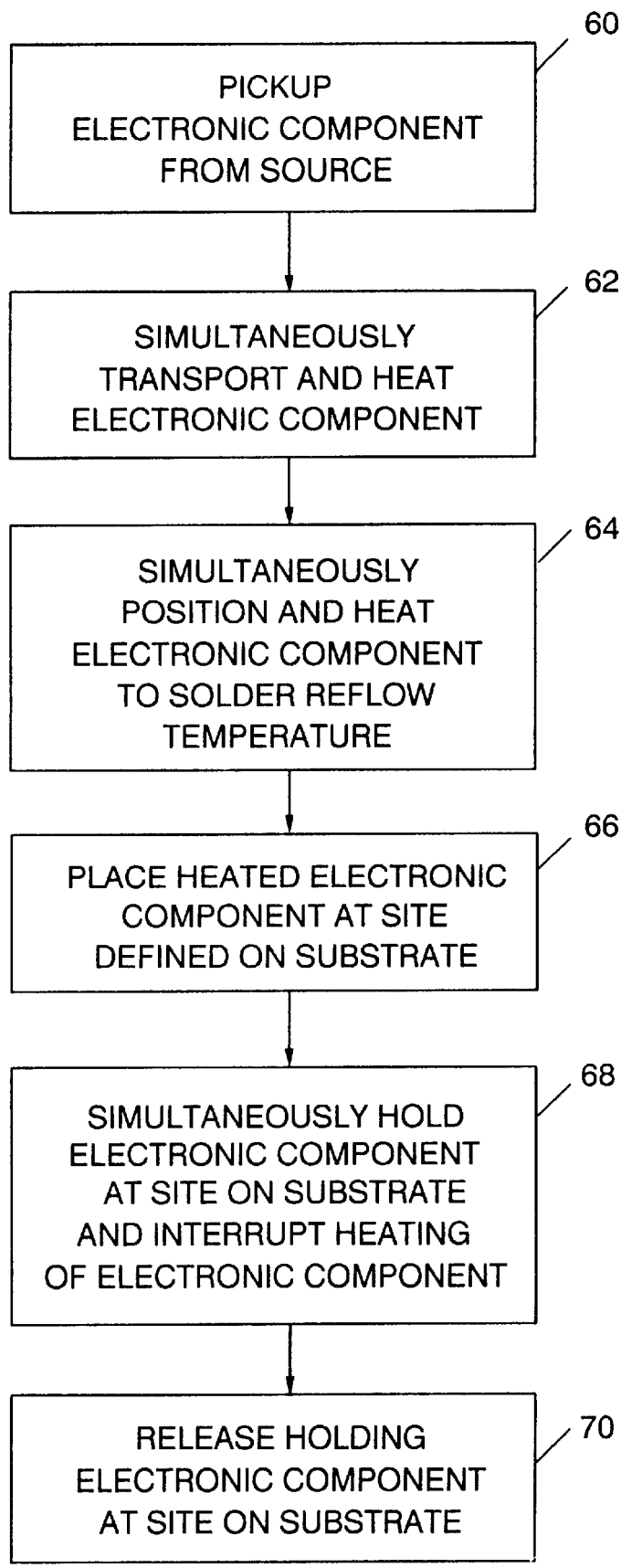
FIG. 7 is a flow diagram of the process for attaching an electronic component to a substrate in accordance with the present invention.

As soon as the chip 48 is accurately positioned, it is placed on the designated site on the substrate 54, as represented in block 66 of FIG. 7 and shown schematically in FIG. 5. Immediately upon placement of the chip 48, current flow to the heating element 30 is interrupted. Again, because of the low mass and high thermal conductivity of the typical chip 48, the chip quickly cools to a temperature below the reflow temperature of the solder, whereupon the solder becomes solidified and the chip 48 it both physically and electrically attached to the substrate 54. During cooling of the respective contact points, typically requiring on the order of about five seconds, the chip 48 is held in its designated position by the vacuum head 10, as represented at block 68 of FIG. 7. After solidification of the reflowed solder at the respective interface contacts between the chip 48 and the substrate 54, vacuum flow from the vacuum inlet port 26 of the vacuum tip 22 is interrupted, whereupon the chip is released from the pickup head 10, as represented at block 70 in FIG. 7, and the pickup head 10 is lifted from the work station as represented schematically in FIG. 6.

Desirably, during the return of the pickup head to the conveyorized feeder for pickup of the next chip 48, the vacuum tip 22 is maintained at an elevated temperature, for example about 150° C., by low current flow through the heating element 30, so that when the component contact surface 24 of the vacuum tip 22 is brought into contact with the next chip 48, heat is immediately transferred to the chip and the ramp up time to achieve the reflow temperature is reduced. The flow of shielding gas is preferably a continuous flow throughout all cycles of the attachment process. However, if desired, the flow may be interrupted after release of an attached chip, and then reinitiated upon pickup of the next chip.

Thus, it can be seen that the pickup head embodying the present invention provides an effective tool for attaching electrical components such as C4 chips to a substrate. The ceramic vacuum tip 22 having a resistance heating element 30 embedded within the tip, provides heat to a chip 48 during transportation and positioning, whereby when the chip 48 is ready for placement on a substrate 54, the solder on the chip 48, or alternatively the contacts 50 on the chip 48, are heated to the reflow temperature of solder predisposed on either the contacts 50 of the chip 48 or on contact areas 46 of the substrate 54. The pickup head 10 embodying the present invention, and the method, also embodying the present invention, for attaching an electronic components to substrates, reduce manufacturing costs by eliminating heretofore required time-consuming separate process steps to place and heat the components 48, associated capital equipment investment, and consequent longer cycle times. Also, the provision of a protective shielding gas, such as nitrogen, around the chip 48, during heating and placement of the chip 48 on a substrate 54, prevents undesirable degradation of the heated solder and contact areas during the attachment process.

Although the present invention is described in terms of a preferred exemplary embodiment, those skilled in the art will recognize that changes in the described embodiment may be made without departing from the spirit of the invention. Other aspects, features and advantages of the present invention may be obtained from the study of this disclosure and the drawings, along with the appended claims.

What is claimed is:

1. A method for attaching an electronic component to a substrate on which at least one of said electronic component and said substrate have solder predisposed on at least one contact member thereof, said process comprising:

picking said electronic component from a supply source;

transporting said electronic component from said supply source while simultaneously heating said electronic component;

positioning said electronic component over a preselected site defined on said substrate while simultaneously heating said electronic component to a temperature sufficient to effect solder reflow of the solder predisposed on said at least one contact member of said at least one of the electronic component and the substrate;

placing said electronic component on the preselected site defined on the substrate;

simultaneously holding said electronic component on said preselected site defined on the substrate and interrupting the heating of said electronic component whereby the temperature of said electronic component drops to a temperature below said temperature sufficient to effect solder reflow and said solder becomes solidified; and subsequently releasing the holding of the electronic component on the preselected site defined on the substrate.

2. A method for attaching an electronic component to a substrate, as set forth in claim 1, wherein said method includes flowing a stream of a shielding gas over said electronic component during transporting, positioning and placing said electronic component.

3. A method for attaching an electronic component to a substrate, as set forth in claim 1, wherein said shielding gas in nitrogen.

* * * * *